(12) United States Patent
Shin et al.

(10) Patent No.: US 6,943,577 B2
(45) Date of Patent: Sep. 13, 2005

(54) MULTICHIP PACKAGE TEST

(75) Inventors: Young-Gu Shin, ChoongChungNam-do (KR); Kyoung-Il Heo, ChoongChungNam-do (KR); Hyoung-Young Lee, Kyunggi-do (KR); Hyuk Kwon, ChoongChungNam-do (KR); Ki-Bong Ju, ChoongChungNam-do (KR); Jeong-Ho Bang, Kyunggi-do (KR); Hyun-Seop Shim, ChoongChungNam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/677,743

(22) Filed: Oct. 1, 2003

(65) Prior Publication Data

US 2004/0119491 A1 Jun. 24, 2004

(30) Foreign Application Priority Data

Oct. 1, 2002 (KR) .................. 10-2002-0059837

(51) Int. Cl.$^7$ .............................................. G01R 31/28
(52) U.S. Cl. ........................................ 324/765; 714/724
(58) Field of Search ................................ 324/537, 754, 324/760, 765; 714/718, 724

(56) References Cited

U.S. PATENT DOCUMENTS

| | | | | |
|---|---|---|---|---|
| 4,467,400 A | * | 8/1984 | Stopper ...................... | 361/767 |
| 4,961,053 A | * | 10/1990 | Krug .......................... | 324/537 |
| 5,070,297 A | * | 12/1991 | Kwon et al. ................. | 324/754 |
| 5,389,556 A | * | 2/1995 | Rostoker et al. ............. | 438/17 |
| 5,399,505 A | * | 3/1995 | Dasse et al. ................. | 438/17 |
| 5,701,666 A | * | 12/1997 | DeHaven et al. ............. | 29/831 |

FOREIGN PATENT DOCUMENTS

| | | |
|---|---|---|
| JP | 09-311161 | 12/1997 |
| KR | 2001-0104719 | 11/2001 |

OTHER PUBLICATIONS

English language abstract of Japnese Publication No. 09–311161, Dec. 1997.

English language abstract of Korean Publication No. 2001–0104719, Nov. 2001.

* cited by examiner

*Primary Examiner*—Ernest Karlsen
(74) *Attorney, Agent, or Firm*—Marger Johnson & McCollom, P.C.

(57) ABSTRACT

A test apparatus for testing a multi-chip package comprising a multiplicity of semiconductor chips, which includes a test driver having one drive channel and at least one input/output channel. A test board is mounted with the multi-chip package. Drive pins of the semiconductor chips are parallel connected to the drive channel, and input/output pins of the semiconductor chips are parallel connected to the input/output channel.

2 Claims, 2 Drawing Sheets

MULTICHIP PACKAGE TEST

This U.S. non-provisional patent application claims priority under 35 U.S.C. §119 of Korean Patent Application No. 2002-0059837 filed on Oct. 1, 2002, the contents of which are hereby incorporated in their entirety by reference.

FIELD OF THE INVENTION

The present invention generally relates to testing semiconductor chips and more specifically, to testing a multi-chip package including a multiplicity of semiconductor chips.

BACKGROUND OF THE INVENTION

Most semiconductor chip products are treated in a typical testing board system as shown in FIG. 1 or FIG. 2, in which a drive channel 2 of a test driver is connected to a drive pin UB of a semiconductor chip (IC1, IC2, IC3, or IC4) to be tested. An input/output channel 3 of the test driver is connected to an input/output pin DQ0. It uses a one-by-one testing scheme where one channel of the test driver is assigned to one pin of the semiconductor chip to be tested.

Such a one-by-one testing scheme is not advantageous to a multi-chip package (MCP), e.g., 1 or 4, mounted with a multiplicity of semiconductor chips in a common assembly process. As it is usual that the MCP operate with different stations and functions in a given system, a test driver is equipped with a multiplicity of drive channels and input/output channels corresponding to drive pins and input/output pins of the semiconductor chips. Moreover, it is necessary to perform a number of test steps according to the number of semiconductor chips mounted on the MCP module, as well as additional test boards. Testing efficiency limits result increasing test complexity and distribution cost. This, in turn, deteriorates test productivity.

SUMMARY OF THE INVENTION

It is an object of the present invention to address the disadvantages associated with prior art test systems. It is another object of the present invention to provide an advanced testing scheme for testing a multi-chip package with improved efficiency and productivity.

A test apparatus includes a test driver including a drive channel and an input/output channel and a test board including a package, the package having mounted thereon a plurality of chips. The drive channel connects to drive pins associated with each of the plurality of chips in parallel. And the input/output channel connects to input/output pins associated with each of the plurality of chips in parallel.

While one of the semiconductor chips is being tested, the drive and input/output pins of other semiconductor chips are held in a high impedance state. The semiconductor chips are tested sequentially. And the drive pins include control and address pins.

A method of testing a package mounted with a plurality of semiconductor chips, comprising connecting a drive channel of a test driver to a plurality of drive pins corresponding to the plurality of semiconductor chips. The method includes connecting an input/output channel of a test driver to a plurality of input/output pins corresponding to the plurality of semiconductor chips and setting, while one of the semiconductor chips is being tested, the drive and input/output pins of other semiconductor chips to a high impedance state. The drive pins include control and address pins.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed on illustrating the principles of the invention.

DESCRIPTION OF THE PREFERRED EMBODIMENT

It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
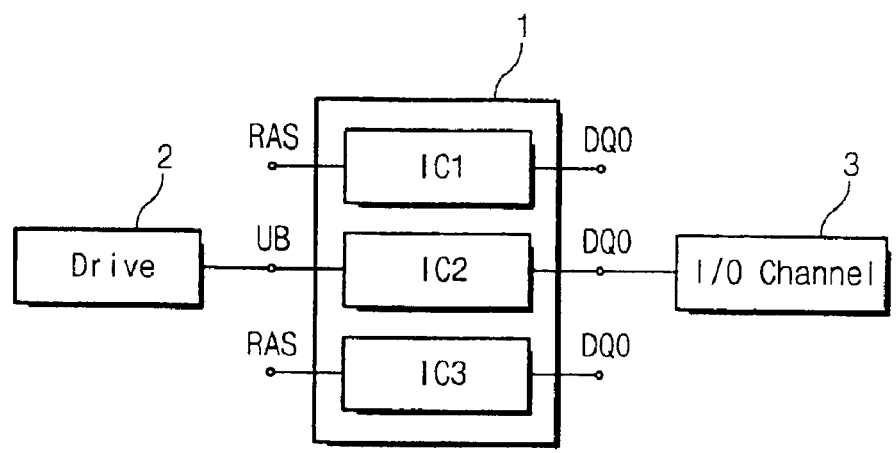
FIGS. 1 and 2 are block diagrams of conventional test schemes.
Figure 2:
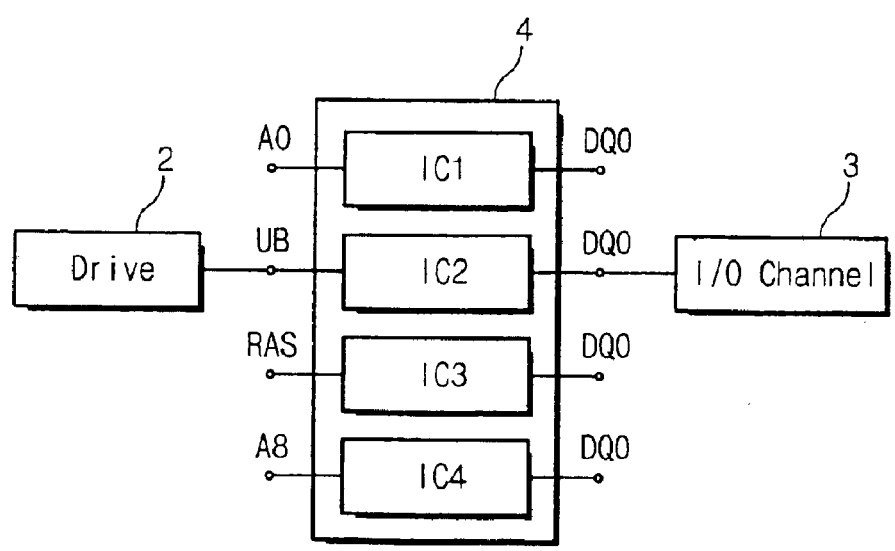
Figure 3:
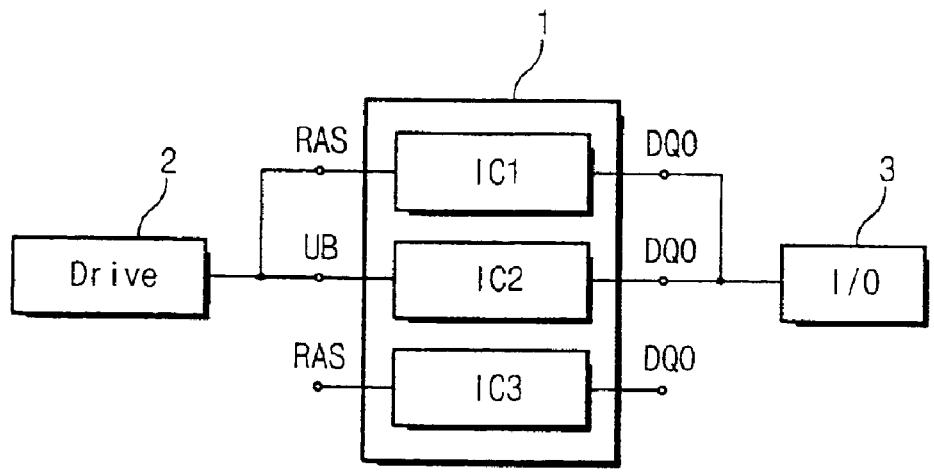
FIGS. 3 and 4 are block diagrams of test schemes according to preferred embodiments of the present invention.
Figure 4:
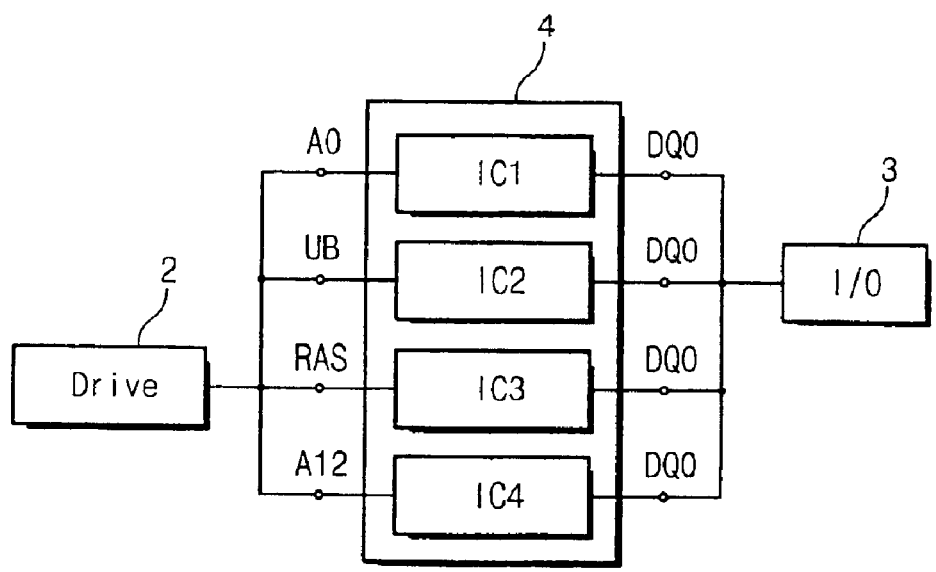

FIGS. 3 and 4 are block diagrams of the present invention. A test driver is connected to a MCP 1 or 4. The MCP 1 or 4 is mounted with a plurality of semiconductor chips IC1~IC4, e.g., DRAM chips. Drive pins of the semiconductor chips are assigned to control signals (e.g., RAS) and address signals (e.g., A0, A8). Input/output pins (e.g., DQ0) of the semiconductor chips are assigned to input/output data signals.

Referring to FIG. 3, a drive channel 2 of the test driver is commonly connected to two drive pins, the RAS (row address strobe) pin and the UB pin, which belong to two semiconductor chips among the semiconductor chips IC1~IC4. An input/output channel 3 of the test driver is commonly connected to two input/output pins, e.g. two DQ0 of IC1 and IC2, which belong each to two semiconductor chips among the semiconductor chips IC1~IC3 and share the input/output channel 3.

While in FIG. 3 one channel (the drive channel or the input/output channel) is common to two pins belonging to different semiconductor chips, FIG. 4 shows one channel is connected with four pins also belonging to different chips. Referring to FIG. 4, the drive channel 2 is commonly connected to the A0 (address) pin of IC1, the UB pin of IC2, the RAS pin of IC3, and the A12 (address) pin of IC4.

It is available to arrange the pins shared by the drive channel 2 or the input/output channel 3 in number of plurality, e.g., more than two at least. While the exemplary embodiments shown in FIGS. 3 and 4 shows the features of two pins for one channel and four pins for one channel, more than four pins of the semiconductor chips of the MCP can be shared by one drive channel or one input/output channel of the test driver.

In proceeding a test operation with the shared pin connection (or parallel pin connection) shown in FIG. 3 or 4, tested semiconductor chips receive and transmit valid test signals while not tested semiconductor chips are forced into high impedance (high-Z) states. This is done to obviate the mutual interference between the semiconductor chips connected to the channel in parallel through their pins. For instance, in FIG. 3, the input/output pin DQ0 of IC2 maintains the high-Z state while the semiconductor chip IC1 is running in the test process. The pins connected to the drive channel or the input/output channel with the shared type are alternatively and sequentially coupled to the test signals by means of switching operations using a software to determine the validity of signal transmissions between them.

The present invention enhances the testability for multi-chip package modules by increasing the number of semiconductor chips parallel tested, improving test productivity.

Although the preferred embodiments of the present invention have been disclosed for illustrative purposes, those skilled in the art will appreciate that various modifications, additions and substitutions are possible, without departing from the scope and spirit of the invention as described in the accompanying claims.

We claim:

1. A method of testing a package mounted with a plurality of semiconductor chips, comprising:

connecting a drive channel of a test driver to a plurality of drive pins corresponding to the plurality of semiconductor chips;

connecting an input/output channel of a test driver to a plurality of input/output pins corresponding to the plurality of semiconductor chips; and setting, while one of the semiconductor chips is being tested, the drive and input/output pins of other semiconductor chips to a high impedance state.

2. The method of claim 1 where the drive pins include control and address pins.

* * * * *